(12) United States Patent  
Shao et al.

(10) Patent No.: US 11,637,189 B1  
(45) Date of Patent: Apr. 25, 2023

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 0 days.

(21) Appl. No.: 17/932,394

(22) Filed: Sep. 15, 2022

Related U.S. Application Data

(63) Continuation of application No. PCT/CN2022/102679, filed on Jun. 30, 2022.

(30) Foreign Application Priority Data

May 7, 2022 (CN) .......................... 202210494628.6

(51) Int. Cl.
*H01L 29/423* (2006.01)
*H01L 29/786* (2006.01)
*H01L 21/28* (2006.01)

(52) U.S. Cl.
CPC .... *H01L 29/42392* (2013.01); *H01L 29/4011* (2019.08); *H01L 29/78696* (2013.01)

(58) Field of Classification Search
CPC ........... H01L 29/42392; H01L 29/4011; H01L 29/78696
USPC ....................................................... 257/401
See application file for complete search history.

(56) References Cited

U.S. PATENT DOCUMENTS

| 10,263,100 B1* | 4/2019 | Bi ..................... H01L 29/66439 |
| 2010/0133606 A1 | 6/2010 | Jang et al. |
| 2018/0040627 A1 | 2/2018 | Kanakamedala et al. |
| 2022/0123003 A1 | 4/2022 | Young et al. |

FOREIGN PATENT DOCUMENTS

| CN | 111430355 A | 7/2020 |
| CN | 113809093 A | 12/2021 |
| CN | 114121820 A | 3/2022 |
| KR | 20210148939 A | 12/2021 |

OTHER PUBLICATIONS

International Search Report cited in PCT/CN2022/102679 dated Nov. 28, 2022, 15 pages.

* cited by examiner

*Primary Examiner* — Tong-Ho Kim
(74) *Attorney, Agent, or Firm* — Cooper Legal Group, LLC

(57) ABSTRACT

The present disclosure relates to the technical field of semiconductors, and provides a semiconductor structure and a forming method thereof. The forming method includes: providing a base and a plurality of stack structures that are located on the base, arranged at intervals, and extend along a first direction, wherein the stack structures each include a plurality of semiconductor layers arranged at intervals in a direction perpendicular to a surface of the base, and a top surface and a bottom surface opposite to each other of each of the semiconductor layers are each provided with a first sacrificial layer, a surface of the first sacrificial layer that is away from the semiconductor layer is provided with a second sacrificial layer, a same etching process has different etching rates for the first sacrificial layer and the second sacrificial layer, an isolation layer is provided between adjacent ones of the stack structures.

15 Claims, 10 Drawing Sheets

US 11,637,189 B1

SEMICONDUCTOR STRUCTURE AND FORMING METHOD THEREOF

CROSS-REFERENCE TO RELATED APPLICATIONS

This is a continuation of International Application No. PCT/CN2022/102679, filed on Jun. 30, 2022, which is based on and claims the priority to Chinese Patent Application No. 202210494628.6, titled "SEMICONDUCTOR STRUCTURE AND FORMING METHOD THEREOF" and filed on May 7, 2022. The entire contents of International Application No. PCT/CN2022/102679 and Chinese Patent Application No. 202210494628.6 are herein incorporated into the present disclosure for reference.

TECHNICAL FIELD

The present disclosure relates to, but is not limited to, a semiconductor structure and a forming method thereof.

BACKGROUND

With the increasingly high integration density of the dynamic memory, the arrangement of transistors and the size of the transistor in the dynamic memory array structure need to meet higher requirements.

When gate-all-around (GAA) transistors are used as transistors in the dynamic memory, a smaller pattern size can be obtained under given process conditions, which helps increase the integration density of the dynamic memory. A word line structure surrounding a channel region of the GAA transistor is usually formed by a process such as atomic layer deposition (ALD). The shape of the formed word line structure and a spacing distance between the word line structures depend on process conditions for forming the word line structures. However, the process conditions for forming the word line structures cannot precisely control the shape of word line structure and the spacing distance between adjacent word line structures, which may lead to different shapes of different word line structures and different spacing distances between adjacent word line structures, thus affecting the uniformity of storage characteristics of the dynamic memory.

SUMMARY

An overview of the subject matter described in detail in the present disclosure is provided below, which is not intended to limit the protection scope of the claims.

A first aspect of the present disclosure provides a method of forming a semiconductor structure, including: providing a base and a plurality of stack structures that are located on the base, arranged at intervals, and extend along a first direction, wherein the stack structures each include a plurality of semiconductor layers arranged at intervals in a direction perpendicular to a surface of the base, and a top surface and a bottom surface opposite to each other of each of the semiconductor layers are each provided with a first sacrificial layer, a surface of the first sacrificial layer that is away from the semiconductor layer is provided with a second sacrificial layer, a same etching process has different etching rates for the first sacrificial layer and the second sacrificial layer, an isolation layer is provided between adjacent ones of the stack structures, and the base includes a word line region; removing a part of the isolation layer in the word line region, to expose a sidewall of a part of each of the first sacrificial layers in the word line region and a sidewall of a part of each of the second sacrificial layers in the word line region; removing the part of each of the first sacrificial layers in the word line region; forming an initial word line layer in the word line region, wherein a region between the part of each of the second sacrificial layers and a part of a corresponding semiconductor layer, and a region between adjacent ones of parts of the semiconductor layers are filled with the initial word line layer; removing the part of each of the second sacrificial layers in the word line region, to form an etching hole; and partially removing the initial word line layer exposed by the etching hole, to form a plurality of word line structures that are arranged at intervals along the direction perpendicular to the surface of the base.

A second aspect of the present disclosure provides a semiconductor structure formed by using any method of forming a semiconductor structure described above. The semiconductor structure is formed by using the method of forming a semiconductor structure described in the first aspect. The semiconductor structure includes: a base and a plurality of semiconductor layers that are located on the base, arranged at intervals, and extend along a first direction, wherein the base includes a word line region; and word line structures, wherein the word line structures are located on parts of the semiconductor layers in the word line region and are arranged at intervals along a direction perpendicular to a surface of the base.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

REFERENCE NUMERALS

Figure 1:
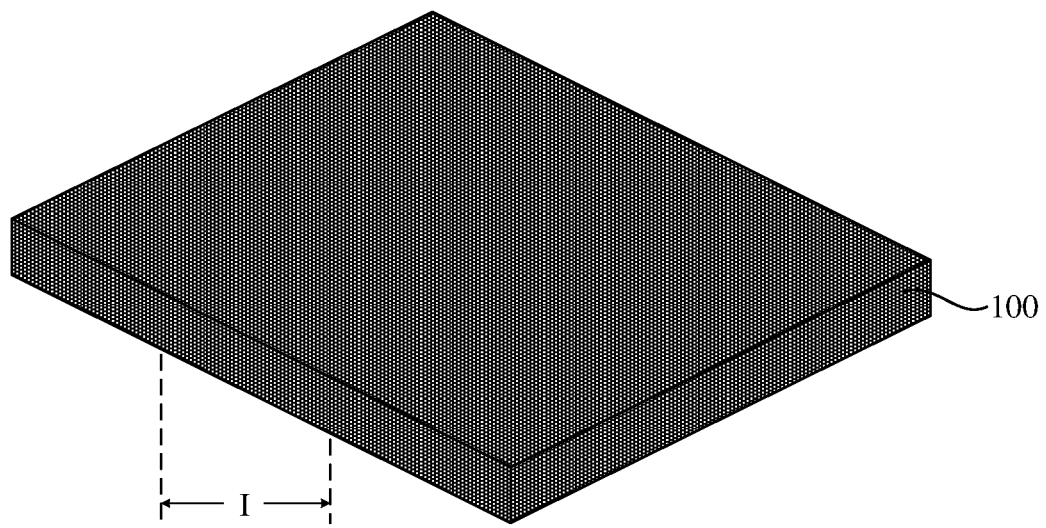
FIG. 1 to FIG. 15 are schematic structural diagrams of a method of forming a semiconductor structure according to an embodiment of the present disclosure.

100. base; 110. initial stack structure; 111. initial semiconductor layer; 112. initial first sacrificial layer; 113. initial second sacrificial layer; 120. stack structure; 121. semiconductor layer; 122. first sacrificial layer; 123.

second sacrificial layer; 130. isolation layer; 131. first trench; 140. support layer; 150. initial word line layer; 151. word line structure; 152. word line isolation layer; 160. gate dielectric layer; 170. first groove; 180. second groove; 190. etching hole; 191. first etching hole; 192. second etching hole; 200. first direction;

I. word line region; II. support region.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the current process conditions for forming the word line structures cannot precisely control the shape of word line structure and the spacing distance between adjacent word line structures, which may lead to different shapes of different word line structures and different spacing distances between adjacent word line structures, thus affecting the electrical performance of the semiconductor structure.

Embodiments of the present disclosure provide a semiconductor structure and a forming method thereof. In the forming method, semiconductor layers located in stack structures in a word line region of a base are channel regions; a first sacrificial layer is formed on each of a top surface and a bottom surface of the semiconductor layer; a second sacrificial layer is formed on a surface of the first sacrificial layer that is away from the semiconductor layer; after a part of an isolation layer between the stack structures in the word line region is removed, a part of each of the first sacrificial layers on the top surface and bottom surface of each semiconductor layer in the word line region is removed, and an initial word line layer is formed in a region between the part of each of the semiconductor layers and a part of a corresponding second sacrificial layer in the word line region and a region between adjacent ones of parts of the semiconductor layers in the word line region. The appearance of the initial word line layer is defined by using the first sacrificial layer between the semiconductor layer and the second sacrificial layer, and a spacing distance between the initial word line layer on the top surface or bottom surface of the semiconductor layer and the initial word line layer on the opposite side is defined by using the second sacrificial layer, such that the formed initial word line layer has high uniformity. Because the initial word line layer has high uniformity, the word line structures formed by partially removing the initial word line layer have high appearance uniformity, and spacing distances between adjacent word line structures also have high uniformity, thus helping improve the electrical performance of the semiconductor structure.

The embodiments of the present disclosure are described in detail below with reference to the drawings. However, those skilled in the art may understand that in each embodiment of the present disclosure, many technical details are proposed to help readers better understand the embodiments of the present disclosure. However, the technical solutions claimed in the embodiments of the present disclosure can still be implemented based on variations and modifications of the following embodiments even without the technical details.

Figure 16:
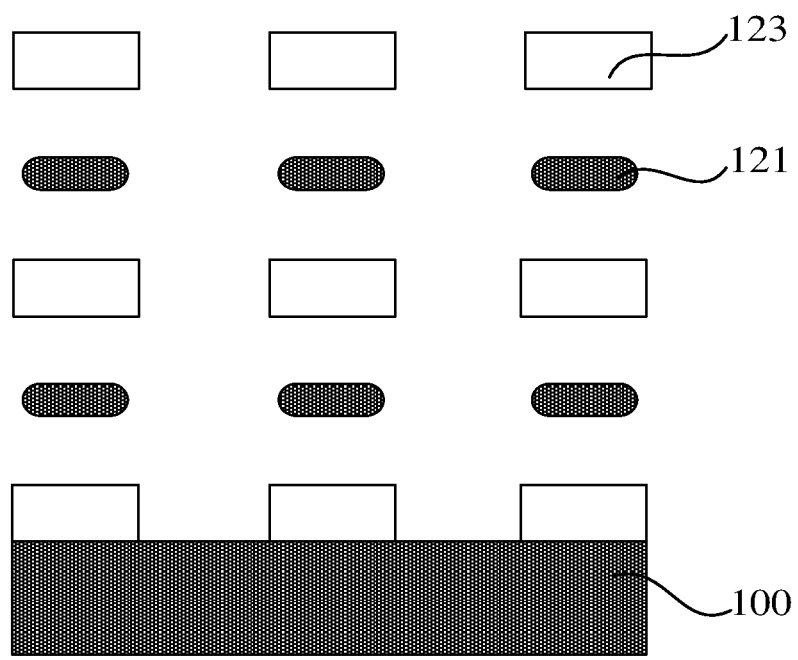
FIG. 16 is a cross-sectional view of a word line region, including chamfered semiconductor layers, of a semiconductor structure according to an embodiment of the present disclosure.
Figure 17:
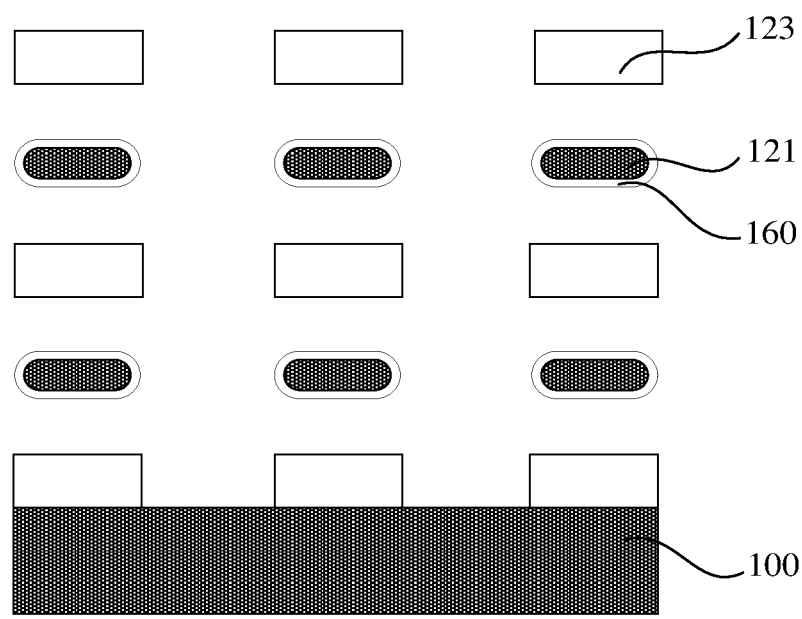
FIG. 17 is a cross-sectional view of a word line region, including a gate dielectric layer, of a semiconductor structure according to an embodiment of the present disclosure.
Figure 18:
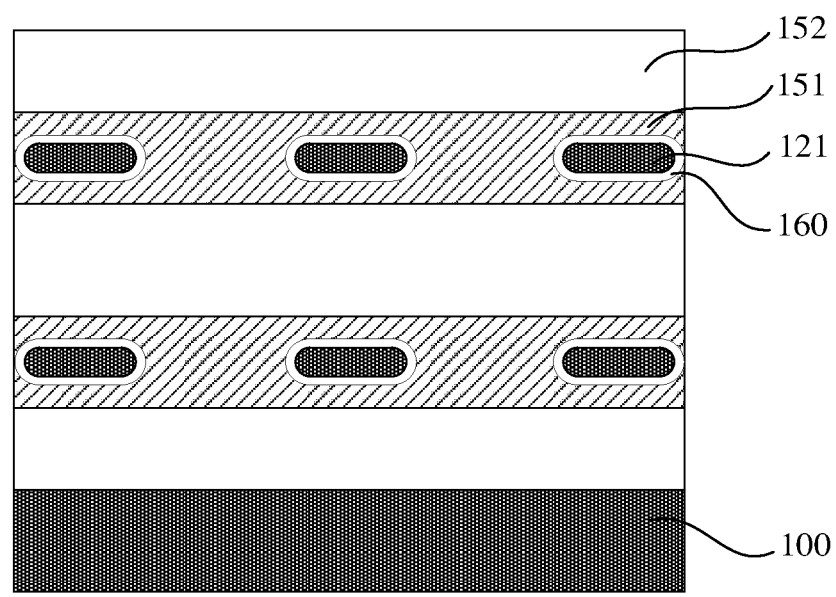
FIG. 18 is a cross-sectional view of a word line region, including a word line isolation layer, of a semiconductor structure according to an embodiment of the present disclosure.

FIG. 1 to FIG. 15 are schematic structural diagrams of a method of forming a semiconductor structure according to an embodiment of the present disclosure; FIG. 16 is a cross-sectional view of a word line region, including chamfered semiconductor layers, of a semiconductor structure according to an embodiment of the present disclosure; FIG. 17 is a cross-sectional view of a word line region, including a gate dielectric layer, of a semiconductor structure according to an embodiment of the present disclosure; and FIG. 18 is a cross-sectional view of a word line region, including a word line isolation layer, of a semiconductor structure according to an embodiment of the present disclosure. It should be noted that, for the brevity of lines, FIG. 10 to FIG. 15 show neither chamfering of the semiconductor layer nor the gate dielectric layer.

Referring to FIG. 1, the method of forming a semiconductor structure includes: providing a base 100, wherein the base 100 includes a word line region I.

In some embodiments, the base 100 is a silicon base, and an epitaxy process based on the silicon base is relatively mature, which helps reduce the process difficulty of forming the stack structures subsequently. In other embodiments, the base 100 may be made of a material directly used to manufacture a semiconductor device. For example, the base 100 may be made of at least one of silicon-on-insulator, germanium, silicon carbide, gallium arsenide or sapphire.

Figure 15:
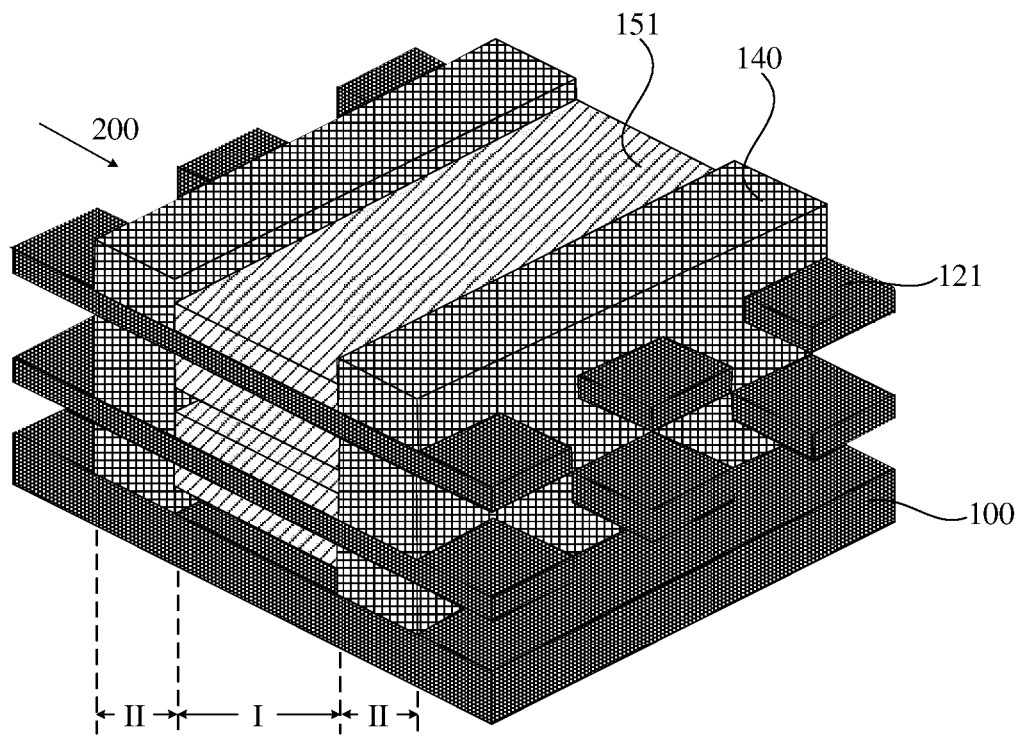

Referring to FIG. 15 and FIG. 18, the word line region I of the base 100 is a region for forming word line structures 151 of transistors and a word line isolation layer 152 between the word line structures 151. It should be noted that, a semiconductor channel in the word line region I is a channel region of a transistor surrounded by the word line structure 151. The transistor may be a gate-all-around (GAA) transistor. The GAA transistor can achieve a minimum pattern size under the given process conditions, which helps increase the integration density of the semiconductor structure.

Figure 4:
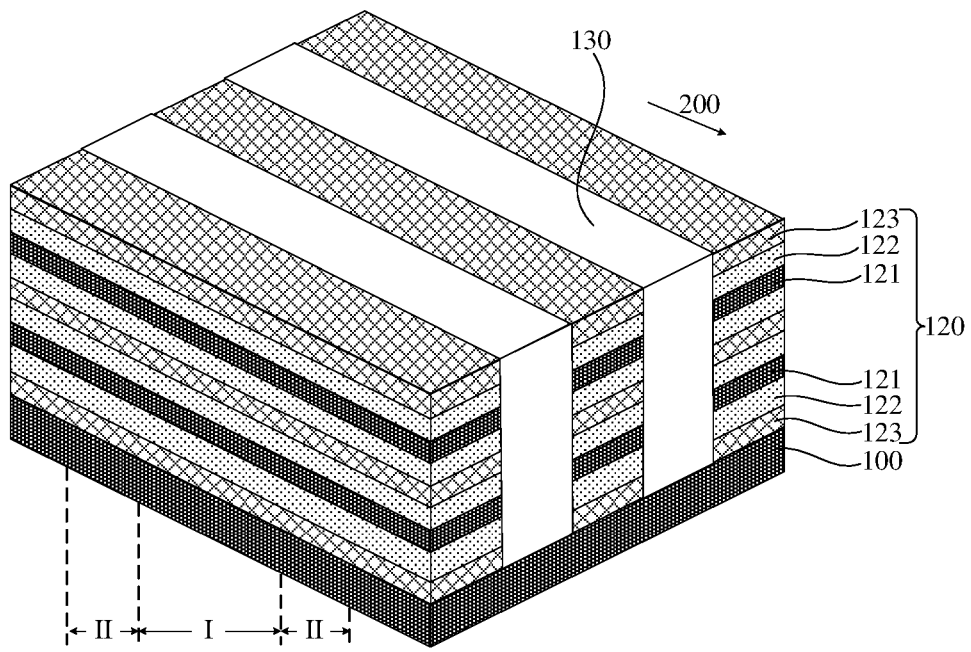

Referring to FIG. 4, a plurality of stack structures 120 are further provided on the base 100. The stack structures 120 extend along a first direction 200 and are arranged at intervals on the base 100. The stack structures 120 each include a plurality of semiconductor layers 121 arranged at intervals in a direction perpendicular to a surface of the base 100, wherein top surface and bottom surface opposite to each other of each semiconductor layer 121 are each provided with a first sacrificial layer 122, a surface of the first sacrificial layer 122 that is away from the semiconductor layer 121 is provided with a second sacrificial layer 123, a same etching process has different etching rates for the first sacrificial layer 122 and the second sacrificial layer 123, and an isolation layer 130 is provided between adjacent ones of the stack structures 120. Referring to FIG. 4 and FIG. 15, the first direction 200 is any direction parallel to the surface of the base 100. The stack structure 120 extending along the first direction 200 includes a plurality of semiconductor layers 121 that are arranged at intervals along the direction perpendicular to the surface of the base 100 and extend along the first direction 200. The semiconductor layer 121 is configured to form a semiconductor channel. The top surface and the bottom surface of the semiconductor layer 121 are each provided with a first sacrificial layer 122. The first sacrificial layer 122 determines the appearance of the word line structure 151 provided on the semiconductor channel of the channel region of the transistor. The surface of the first sacrificial layer 122 that is away from the semiconductor layer 121 is provided with a second sacrificial layer 123. The second sacrificial layer 123 can determine a spacing distance between the word line structures 151. On the basis of the stack structure 120, the appearance of the formed word line structure 151 and the spacing distance between adjacent word line structures 151 are controllable. The uniformity of the word line structures 151 can be improved by improving the uniformity of the semiconductor layers 121, the first sacrificial layers 122, and the second sacrificial layer 123 in the stack structure 120, which helps improve the electrical performance of the semiconductor structure. In addition, the first sacrificial layer 122 and the second sacrificial layer 123 have different etching rates under the same condition. In the subsequent process of forming the word line structures 151, the first sacrificial layer 122 and the second sacrificial layer 123 are removed by using different etching processes, to form uniform word line structures 151. In addition, the isolation layer 130 extending along the first directions 200 between the stack structures 120 is configured to assist in forming the subsequent word line structure 151. The isolation layer 130 may be made of a common isolation material, such as silicon oxide.

Figure 3:
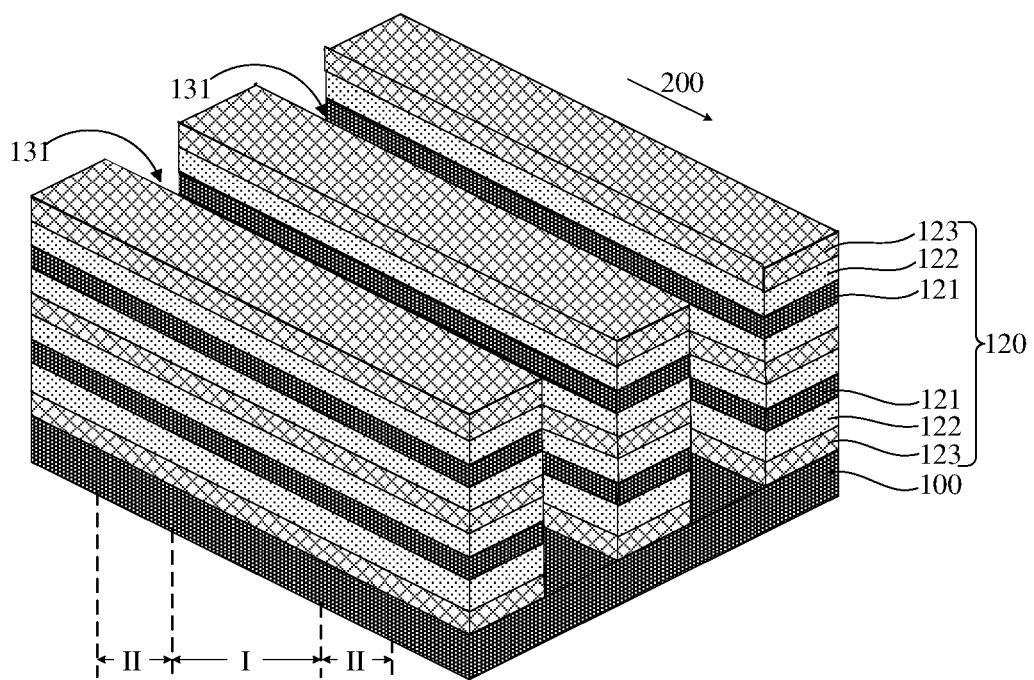

Further referring to FIG. 3, in some embodiments, the first sacrificial layers 122 have a same thickness, and the second sacrificial layers 123 have a same thickness. Referring to FIG. 3 and FIG. 15, the first sacrificial layers 122 with the same thickness can allow the word line structures 151 subsequently formed on the top surfaces or bottom surfaces of the semiconductor layers 121 to have the same thickness, thereby helping improve the uniformity of the word line structures 151. The second sacrificial layers 123 with the same thickness can allow the subsequently formed adjacent word line structures 151 to have the same spacing distance, thereby improving the uniformity of distribution positions of the word line structures 151, which helps improve the electrical performance of the semiconductor structure.

Figure 2:
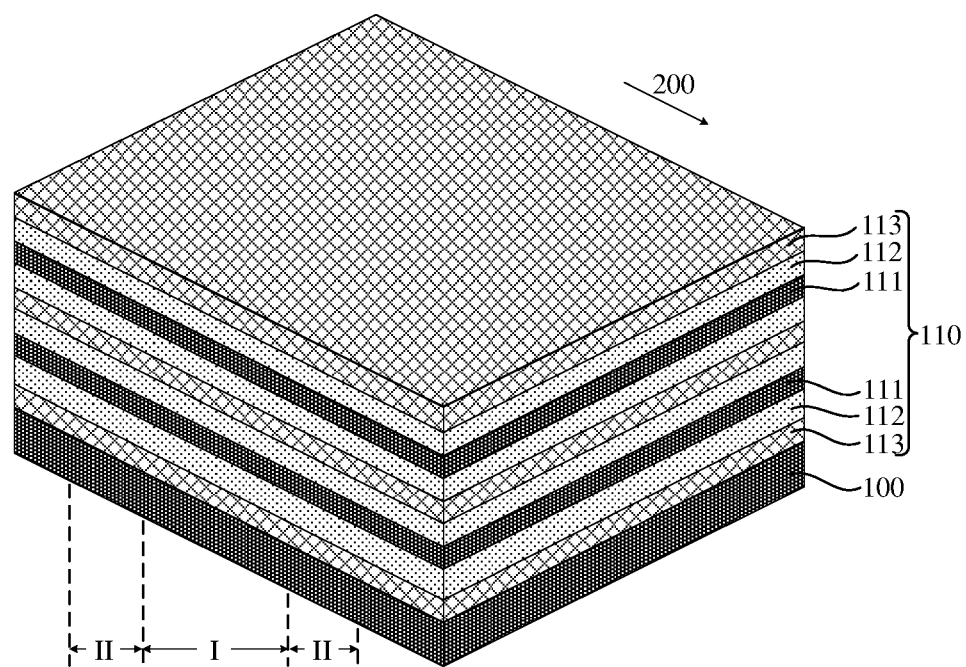

Referring to FIG. 2 to FIG. 4, in some embodiments, forming the stack structures 120 and the isolation layer 130 in the foregoing embodiment may include: forming an initial stack structure 110 on the surface of the base 100, wherein the initial stack structure 110 includes a plurality of initial semiconductor layers 111 that are arranged at intervals in the direction perpendicular to the surface of the base 100, and a top surface and a bottom surface opposite to each other of each of the initial semiconductor layers 111 each have an initial first sacrificial layer 112, and a surface of the initial first sacrificial layer 112 that is away from the initial semiconductor layer 111 has an initial second sacrificial layer 113; patterning the initial stack structure 110, and forming a plurality of stack structures 120 independent of each other; and forming the isolation layer 130 between adjacent ones of the stack structures 120.

In this embodiment, Referring to FIG. 2 and FIG. 15, the initial stack structure 110 is formed on the base 100, and the initial stack structure 110 is patterned to form the stack structures 120. To ensure appearances of the first sacrificial layers 122, appearances of the second sacrificial layers 123, and appearances of the semiconductor layers 121 to be the same in different stack structures 120, that is, to ensure that the formed word line structures 151 are uniform, the initial semiconductor layers 111 with a uniform thickness, the initial first sacrificial layers 112 with a uniform thickness, and initial second sacrificial layers 113 with a uniform thickness may be formed. The initial semiconductor layers 111 in the initial stack structure 110 are configured to form the semiconductor layers 121, and the semiconductor layers 121 are configured to form semiconductor channels of transistors. The uniformity of the semiconductor channels of the transistors formed on the base 100 can be ensured by ensuring the thickness uniformity of the initial semiconductor layers 111 in the initial stack structure 110. The thickness of the initial first sacrificial layers 112 in the initial stack structure 110 defines the thickness of the first sacrificial layers 122, and the thickness of the first sacrificial layers 122 determines the appearances of the subsequently formed word line structures 151. The initial first sacrificial layers 112 with good thickness uniformity help form the word line structures 151 with good appearance uniformity. The thickness uniformity of the initial second sacrificial layers 113 determines thickness uniformity of different second sacrificial layers 123, and the second sacrificial layers 123 with good thickness uniformity allow the spacing distances between the word line structures 151 to be the same, which helps form the evenly distributed word line structures 151. The evenly distributed word line structures 151 with uniform appearances help improve the electrical performance of the semiconductor structure.

In some embodiments, a material of the initial semiconductor layer 111 is silicon. Based on silicon, materials with various properties can be formed by using an epitaxy process, such that the first sacrificial layers 122 and the second sacrificial layers 123 can be easily prepared on the basis of silicon, thereby reducing the manufacturing difficulty of the initial stack structure 110. In other embodiments, the initial semiconductor layer 111 may alternatively be made of other semiconductor channel materials, for example, one of indium gallium zinc oxide (IGZO), indium tungsten oxide (IWO), or indium tin oxide (ITO). When the semiconductor channel is made of the foregoing material, mobility of carriers in the semiconductor channel can be improved, such that the semiconductor channel transfers electrical signals efficiently.

In some embodiments, referring to FIG. 2 and FIG. 3, a material of the first sacrificial layer 122 includes doped SiGe; and a material of the second sacrificial layer 123 includes undoped SiGe. In this way, the initial first sacrificial layer 112 is a doped SiGe layer, and the initial second sacrificial layer 113 is an undoped SiGe layer. When the initial first sacrificial layer 112 and the initial second sacrificial layer 113 are made of the foregoing materials, it mainly achieves the following advantages: On the one hand, doped SiGe and undoped SiGe have different etching rates under the same condition, and therefore can be used as the subsequent first sacrificial layer 122 and second sacrificial layer 123 respectively, to help forming the uniform word line structures 151 (referring to FIG. 15). On the other hand, the doped SiGe and undoped SiGe are both SiGe substantially, and the difference lies in whether SiGe is doped or not. Therefore, during forming of the initial first sacrificial layer 112 and the initial second sacrificial layer 113, a SiGe layer can be formed directly, and then a part of the SiGe layer that is away from the base 100 can be doped along the thickness direction, to form the initial first sacrificial layer 112 and the initial second sacrificial layer 113. The method of forming the SiGe layer and then doping a part of the SiGe layer to form the initial first sacrificial layer 112 and the initial second sacrificial layer 113 helps reduce the manufacturing difficulty of the initial stack structure 110.

In some embodiments, referring to FIG. 2, the initial first sacrificial layer 112, the initial second sacrificial layer 113, and the initial semiconductor layer 111 are formed by using a selective epitaxy process. By forming the initial stack structure 110 through the selective epitaxy process, the initial first sacrificial layer 112, the initial second sacrificial layer 113, the initial semiconductor layer 111, and base 100 have close thermal expansion coefficients and matched lattice coefficients, such that adjacent film layers have close thermal expansion coefficients and matched lattice coefficients. This can avoid a stress change caused by a temperature change and stress mismatch caused by lattice mismatch, which helps avoid the interface mismatch between different film layers or even the rupture of the film layers caused by the stress mismatch, thereby improving the flatness of each film layer in the initial stack structure 110 and the flatness of the base 100.

In this embodiment, the forming the initial stack structure 110 by using a selective epitaxy to form the stack structures 120 and the isolation layer 130 may be as follows: referring to FIG. 2, FIG. 3, and FIG. 4, placing the base 100 in an epitaxial reaction chamber, and injecting a source material of the initial second sacrificial layer 113 to the epitaxial reaction chamber, to form the initial second sacrificial layer 113 with a certain thickness on the surface of the base 100; placing the base 100 on which the initial second sacrificial layer 113 has been formed in the epitaxial reaction chamber, and injecting a source material of the initial first sacrificial layer 112 into the epitaxial reaction chamber, to form the initial first sacrificial layer 112 with a certain thickness on a surface of the initial second sacrificial layer 113 that is away from the base 100; placing the base 100 on which the initial second sacrificial layer 113 and the initial first sacrificial layer 112 have been formed in the epitaxial reaction chamber, and injecting a source material of the initial semiconductor layer 111 to the epitaxial reaction chamber, to form the initial semiconductor layer 111 with a certain thickness on a surface of the initial first sacrificial layer 112 that is away from the base 100; by using the foregoing method of forming the initial first sacrificial layer 112, the initial second sacrificial layer 113, and the initial semiconductor layer 111, sequentially forming film layers of the remaining part of the initial stack structure 110 on a surface of the initial semiconductor layer 111 that is away from the base 100, to form the initial stack structure 110. A first mask layer including a first etching window is formed on a surface of the initial stack structure 110 that is away from the base 100, the initial stack structure 110 exposed by the first etching window is removed to form a plurality of stack structures 120 and a first trench 131 between adjacent stack structures 120. A bottom of the first trench 131 exposes the base 100, and after the first mask layer is removed, the isolation layer 130 is formed in the first trench 131 through deposition or in other manners.

In the foregoing method for forming the stack structures 120 and the isolation layer 130, to allow the first sacrificial layer 122 and the second sacrificial layer 123 to have different etching rates under the same condition, the source material for forming the initial first sacrificial layer 112 may be different from the source material for forming the initial second sacrificial layer 113, thereby forming the first sacrificial layer 122 and the second sacrificial layer 123 having different properties. However, if the source material for forming the initial first sacrificial layer 112 is completely different from the source material for forming the initial second sacrificial layer 113, a chamber for forming the initial first sacrificial layer 112 becomes incompatible with a chamber for forming the initial second sacrificial layer 113, and it is necessary to add process chambers or even manufacturing devices, thus increasing the cost of manufacturing the initial stack structure 110. Based on the foregoing reasons, to ensure forming the first sacrificial layer 122 and the second sacrificial layer 123 having different properties, the source material for forming the initial first sacrificial layer 112 may be partially but not exactly the same as the source material for forming the initial second sacrificial layer 113. Different source materials may be doped materials. Manufacturing processes with highly similar source materials makes the chamber for forming the initial first sacrificial layer 112 compatible with the chamber for forming the initial second sacrificial layer 113, thereby avoiding adding extra manufacturing devices and helping reduce the cost of the semiconductor structure.

In some embodiments, the source material for forming the initial first sacrificial layer 112 includes a silicon source gas, a germanium source gas, and a dopant source gas; and the source material for forming the initial second sacrificial layer 113 includes the silicon source gas and the germanium source gas. The initial first sacrificial layer 112 formed by using the silicon source gas, the germanium source gas, and the dopant source gas is a doped SiGe layer, and the initial second sacrificial layer 113 formed by using the silicon source gas and the germanium source gas is an undoped SiGe layer. The doped SiGe layer and the undoped SiGe layer have different etching rates under the same condition. Moreover, the chamber for forming the initial first sacrificial layer 112 by using the silicon source gas and the germanium source gas and the chamber for forming the initial second sacrificial layer 113 by using the silicon source gas and the germanium source gas are compatible, which avoids adding extra manufacturing devices and helps reduce the manufacturing cost.

Referring to FIG. 4 to FIG. 7, in some embodiments, the base 100 further includes support regions II respectively adjacent to two opposite ends of the word line region I that are arranged along the first direction 200, and before the removing a part of the isolation layer 130 in the word line region I, the method further includes: patterning the isolation layer 130, to form a plurality of first grooves 170 located in each of the support regions II, wherein each of the first grooves 170 exposes a sidewall of a part of each of the first sacrificial layers 122 in the support region II and a sidewall of a part of each of the second sacrificial layers 123 in the support region II; removing the part of each of the first sacrificial layers 122 and the part of each of the second sacrificial layers 123 located in the support region II; and forming a support layer 140 in each of the support regions II, wherein a region between adjacent ones of parts of the semiconductor layers 121 in the support region II is filled with the support layer 140.

Figure 5:
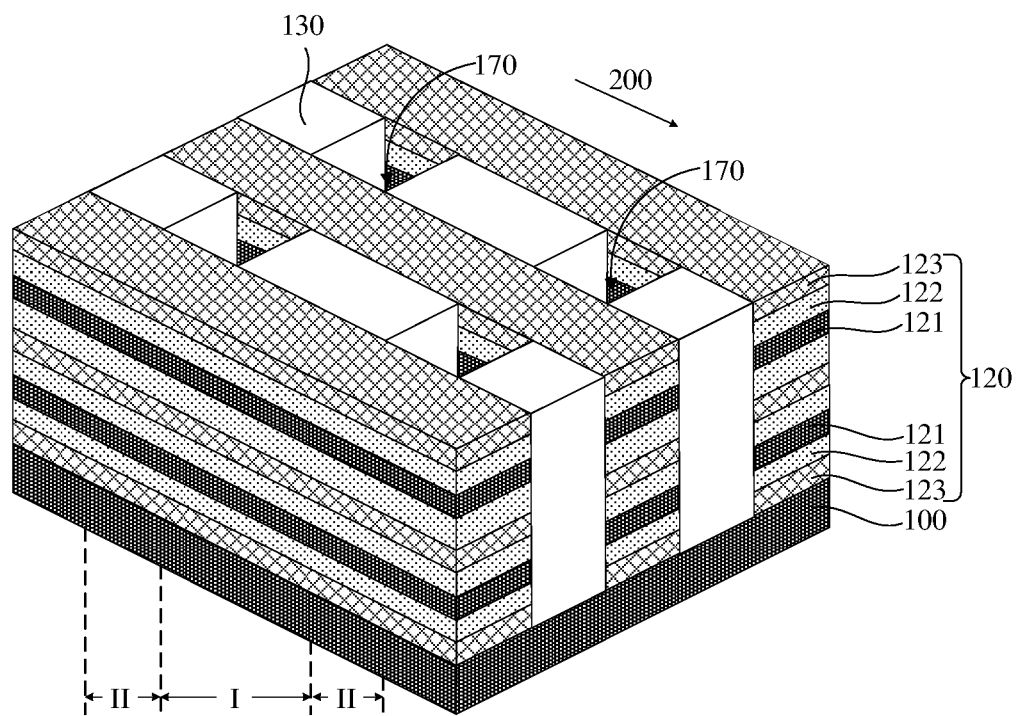
Figure 6:
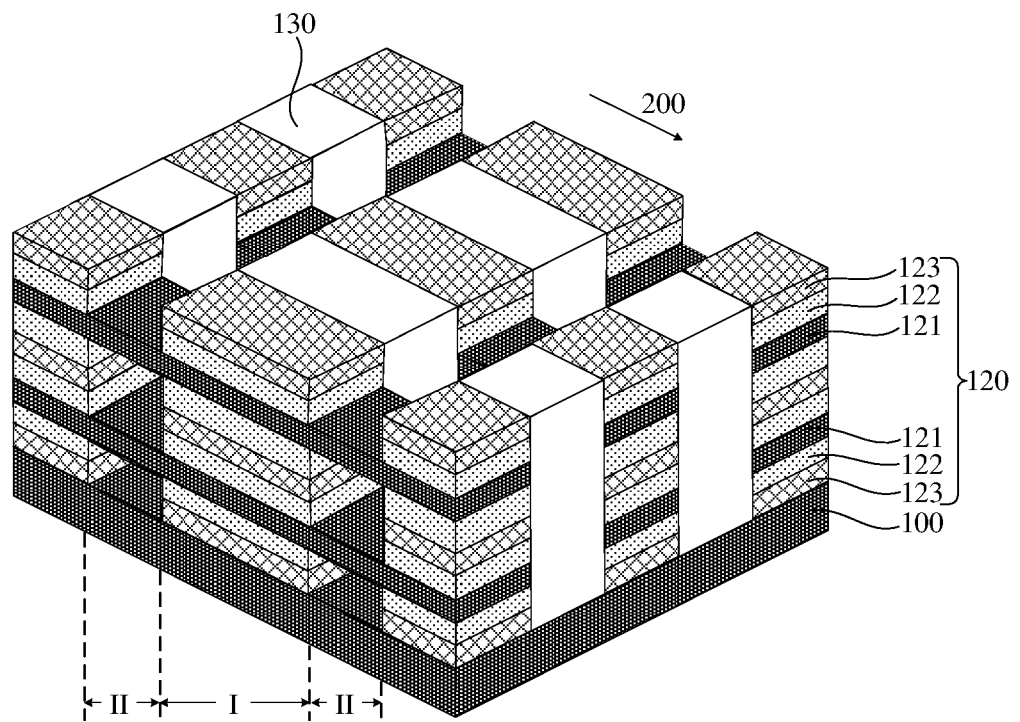
Figure 7:
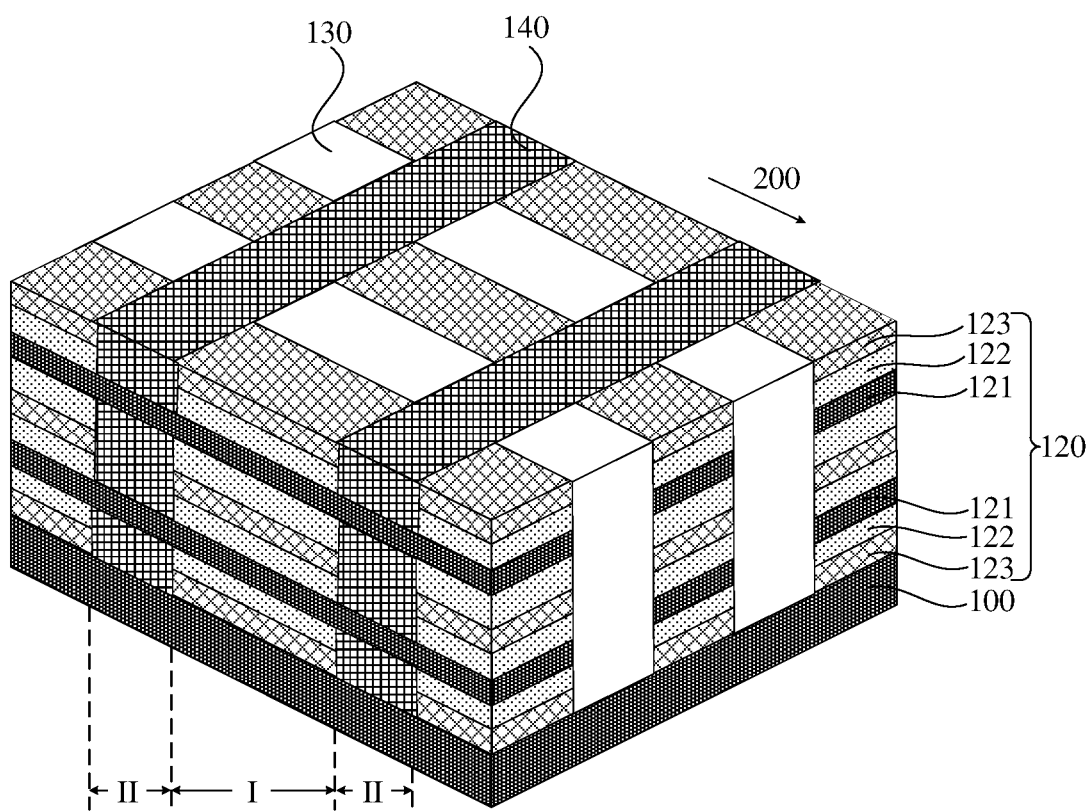

Referring to FIG. 7, the support region II is a region in which the support layer 140 is arranged. The support layer 140 located between adjacent ones of parts of the semiconductor layers 121 in the support region II supports parts of the semiconductor layers 121 in the support region II, thereby supporting the semiconductor layers 121 on the base 100, which helps improve the stability of the semiconductor structure. In this embodiment, the forming the support layer 140 may be as follows: A second mask layer is formed on the base 100 including the isolation layer 130 and the stack structures 120, wherein the second mask layer includes a second etching window exposing a part of the isolation layer 130 in the support region II. The part of the isolation layer 130 in the support region II is removed through the second etching window. Referring to FIG. 5, a plurality of first grooves 170 are formed, wherein the bottom of each first groove 170 exposes the base 100. Because the material of the first sacrificial layer 122 and the material of the second sacrificial layer 123 are different from the material of the semiconductor layer 121, through the first groove 170, a part of each of the first sacrificial layers 122 and a part of each of the second sacrificial layer 123 in the support region II that are exposed by the sidewall of the first groove 170 are removed by using an etching process having a high etching selectivity for the first sacrificial layer 122 and the second sacrificial layer 123, a part of each of the semiconductor layers 121 in the support region II is retained, and the second mask is removed, to form the semiconductor structure as shown in FIG. 6. Referring to FIG. 7, the support layer 140 is formed in a region between adjacent ones of parts of the semiconductor layers 121 in the support region II. The support layer 140 is formed by using a deposition process. The support layer 140 is silicon nitride having high hardness, which can provide desirable support for the semiconductor structure.

Figure 8:
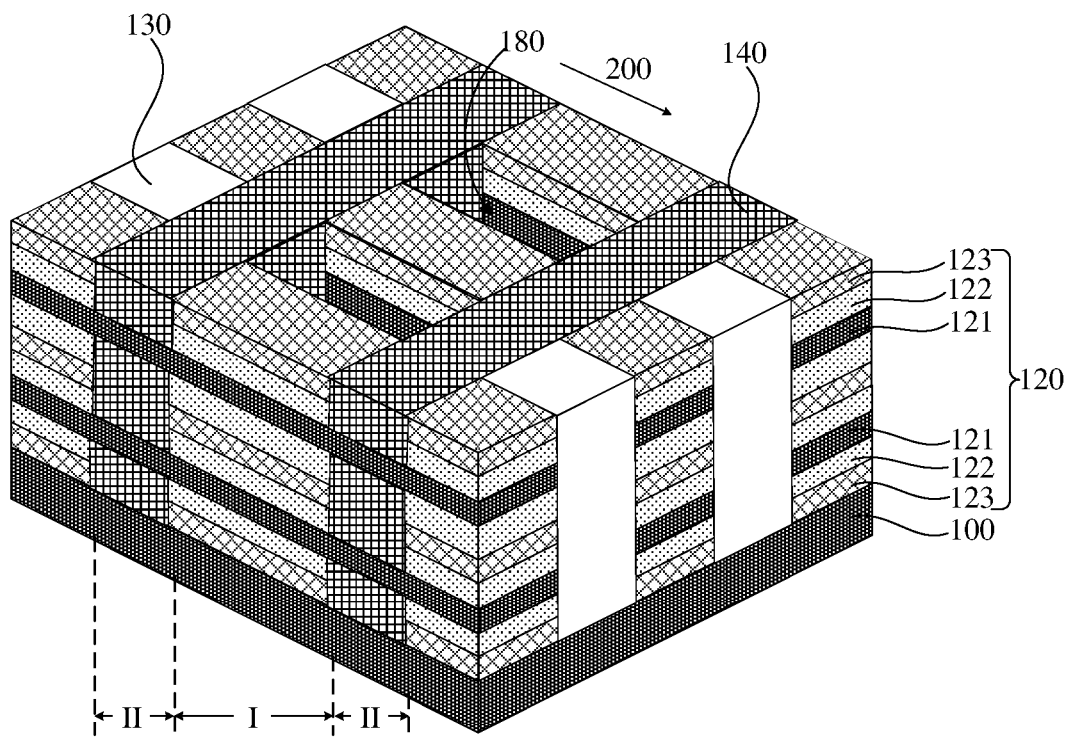
Figure 9:
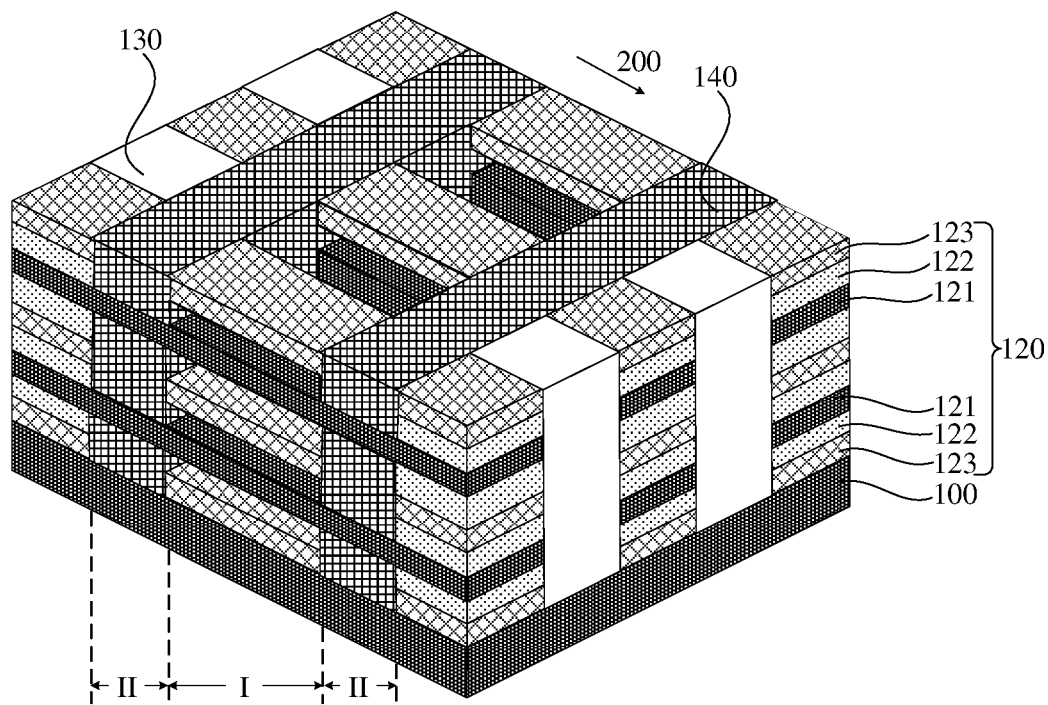

Referring to FIG. 8 to FIG. 9, after the support layer 140 is formed, the method of forming a semiconductor structure further includes a part of the isolation layer 130 in the word line region I, to expose a sidewall of a part of each of the first sacrificial layers 122 in the word line region I and a sidewall of a part of each of the second sacrificial layers 123 in the word line region I; removing the part of each of the first sacrificial layers 122 in the word line region I; and removing the part of the isolation layer 130 in the word line region I. That is, the part of each of the first sacrificial layers 122 and the part of each of the second sacrificial layers 123 in the stack structures 120 in the word line region I can be exposed, then the part of each of the first sacrificial layers 122 in the word line region I is removed to expose the part of each of the semiconductor layers 121 in the word line region I, and the exposed part of each of the semiconductor layers 121 in the word line region I is further processed. The removing a part of the isolation layer 130 in the word line region I may include: forming a third mask layer (not shown in the figure) on surfaces of the stack structures 120 that are away from the base 100 (except the part of the isolation layer 130 in the word line region I) and on surfaces of the support layers 140 that are away from the base 100, wherein the third mask layer includes third etching windows exposing the part of the isolation layer 130 in the word line region I; and etching to remove the part of the isolation layer 130 exposed by the third etching windows, to form second grooves 180. Referring to FIG. 8, a bottom of each second groove 180 exposes the base 100, and a sidewall of the second groove 180 expose a sidewall of a part of each of the first sacrificial layers 122, a sidewall of a part of each of the second sacrificial layers 123, and a sidewall of a part of each of the semiconductor layers 121 of the stack structures 120 in the word line region I. Based on different etching selectivities of the first sacrificial layer 122, the second sacrificial layer 123, and the semiconductor layer 121, the part of each of the first sacrificial layers 122 exposed by the second groove 180, i.e., the part of each of the first sacrificial layers 122 in the word line region I is removed by using an etching condition with a high etching rate for the first sacrificial layer 122, and the third mask is removed, to form the semiconductor structure as shown in FIG. 9.

Figure 10:
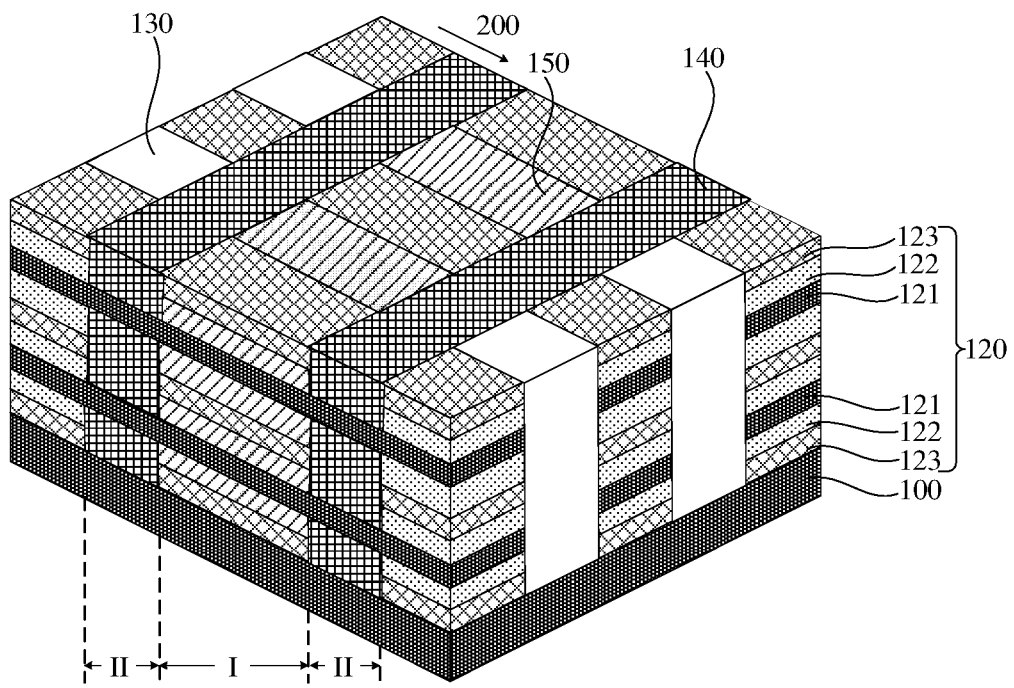

Referring to FIG. 9, FIG. 10, and FIG. 16, in some embodiments, after the part of each of the first sacrificial layers 122 in the word line region I is removed, and before the initial word line layer 150 is formed, the method further includes: oxidizing the parts of the semiconductor layers 121 in the word line region I to form an oxide layer (not shown in the figure), such that the parts of the semiconductor layers 121 in the word line region I are chamfered; and removing the oxide layer. In this embodiment of the present disclosure, the semiconductor layer 121 is a rectangular column structure. Referring to FIG. 16, the chamfering of the semiconductor layer 121 makes a corner between adjacent surfaces of the part of the semiconductor layer 121 in the word line region I smooth, which helps avoid tip discharge or leakage in the part of the semiconductor layer 121 of the semiconductor channel, thereby improving the electrical performance of the semiconductor structure. It should be noted that in other embodiments, the semiconductor layer 121 may also be a cylindrical structure, an elliptical column structure, a square column structure, or other irregular structures. It may be understood that when the semiconductor layer 121 is a square column structure, the corner between adjacent sidewalls of the square column structure can be rounded to avoid tip discharge.

Referring to FIG. 9 and FIG. 17, in some embodiments, after the oxide layer is removed, the method further includes: forming a gate dielectric layer 160, wherein the gate dielectric layer 160 covers a surface of each of the parts of the semiconductor layers 121 in the word line region I. In other words, the gate dielectric layer 160 surrounds the part of the semiconductor layer 121 in the word line region I. In addition, a material of the gate dielectric layer 160 may be one of silicon oxide, silicon nitride, silicon oxynitride, or other high-K dielectric materials.

Referring to FIG. 10 with reference to FIG. 17, the method of forming a semiconductor structure further includes: forming an initial word line layer 150 in the word line region I, wherein a region between the part of each of the second sacrificial layers 123 and a part of a corresponding semiconductor layer 121 and a region between adjacent ones of parts of the semiconductor layers 121 are filled with the initial word line layer 150. A material of the initial word line layer 150 may be one of polysilicon, titanium nitride, tantalum nitride, copper, tungsten or aluminum. The forming the initial word line layer 150 may include: forming, through an ALD process, the initial word line layer 150 on a surface of a part of each semiconductor layer 121 in the word line region I, i.e., on a surface of a part of the gate dielectric layer 160, which is away from the semiconductor layer 121, of the part of each semiconductor layer 121 in the word line region I, wherein a region between the second sacrificial layer 123 and a part of the gate dielectric layer 160 of the semiconductor layer 121 and a region between parts of the gate dielectric layer 160 of adjacent semiconductor layers 121 are filled with the initial word line layer 150. The region between the second sacrificial layer 123 and the part of the gate dielectric layer 160 of the semiconductor layer 121 and the region between the parts of gate dielectric layer 160 of adjacent semiconductor layers 121 limit the appearance of the initial word line layer 150, thus forming the uniformly distributed initial word line layer 150. The uniformly distributed initial word line layer 150 helps form uniform word line structures, Referring to FIG. 11 to FIG. 12, after the initial word line layer 150 is formed, the method of forming a semiconductor structure further includes: removing the part of each of the second sacrificial layers 123 in the word line region I, to form an etching hole 190. The etching hole 190 formed by removing the part of each of the second sacrificial layers 123 in the word line region I provide a basis for partially removing the initial word line layer 150. In some embodiments, the sizes of parts of the etching hole 190 in the word line region I are exactly the same. Referring to FIG. 15 and FIG. 18, in the word line structures 151 formed after the initial word line layer 150 is partially removed by using parts of the etching hole 190 with the same size, spacing distances between adjacent word line structures 151 are also completely the same, which helps improve the uniformity of the word line structures 151.

Figure 11:
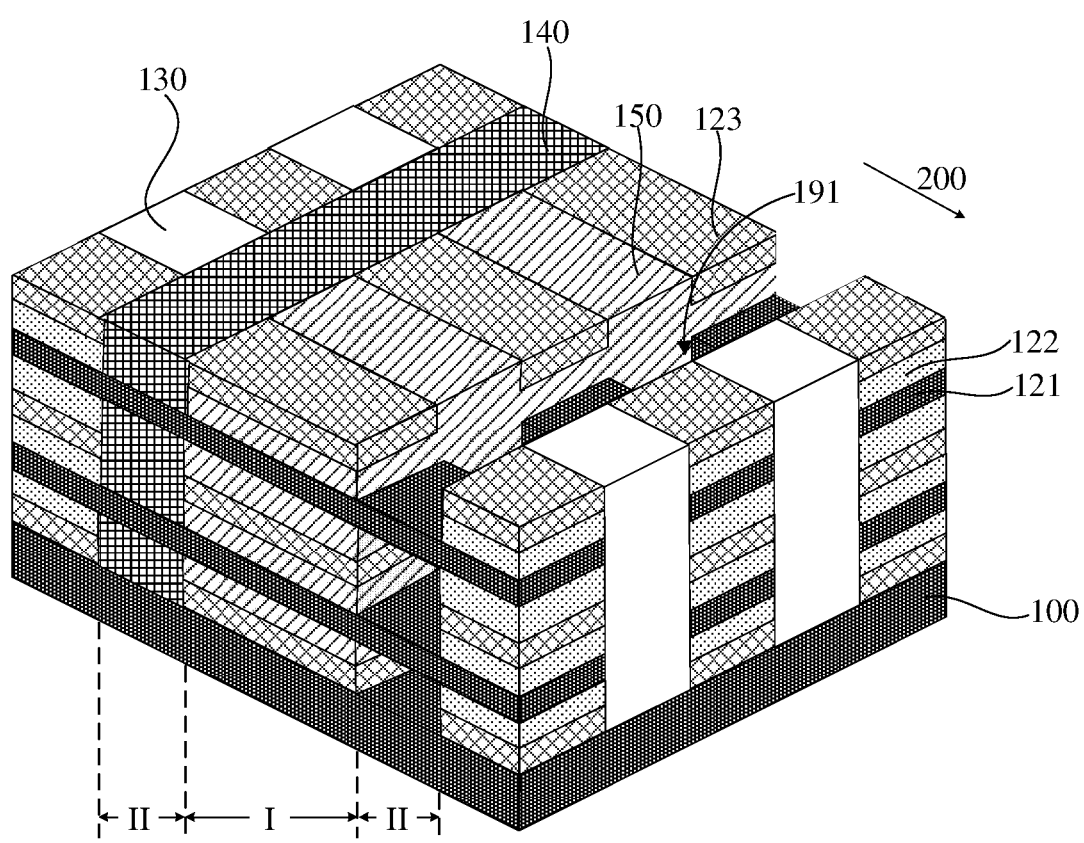
Figure 12:
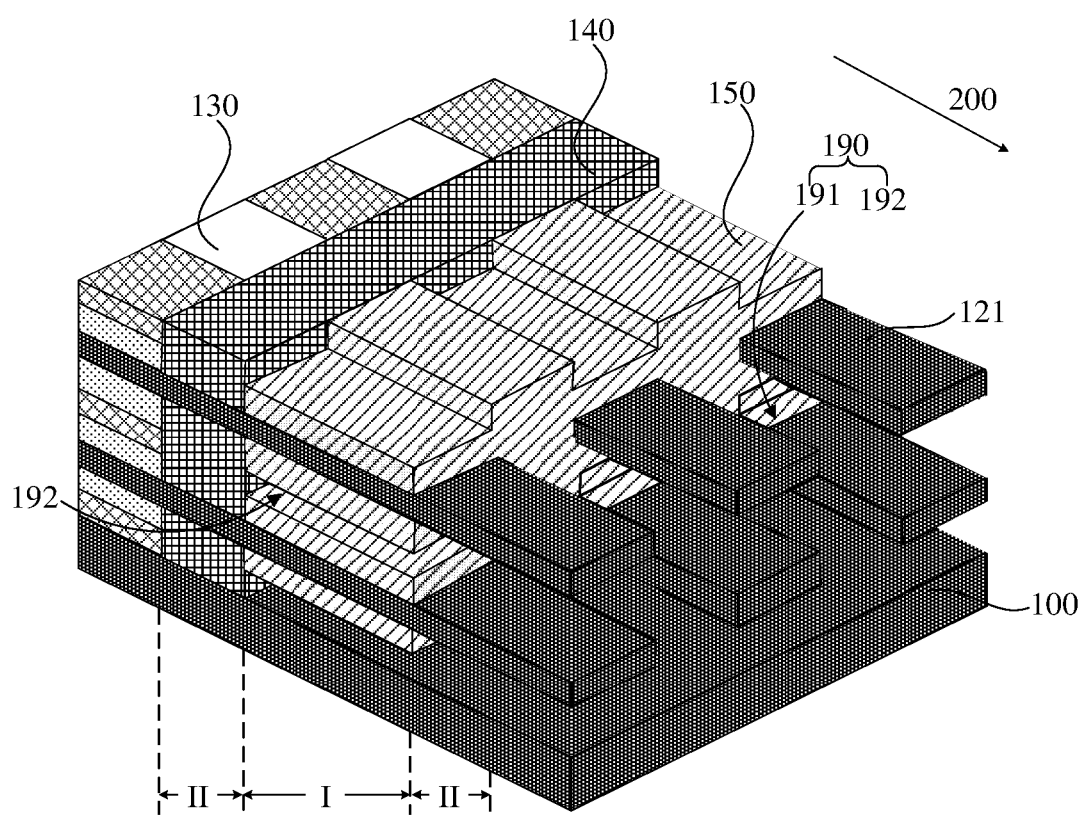

Referring to FIG. 11 to FIG. 12, in some embodiments, the forming the etching hole 190 may include: removing the support layer 140 of one of the support regions II adjacent to the word line region I, and forming a first etching hole 191; and etching to remove a part of each of the second sacrificial layers 123 exposed by the first etching hole 191, and forming a second etching hole 192, wherein the second etching hole 192 is in communication with the first etching hole 191 to form the etching hole 190. Because it is difficult to directly remove the part of the second sacrificial layer 123 covered by the initial word line layer 150, this embodiment provides a method of removing the support layer 140 at either side of the word line region I. By removing the support layer 140 at either side of the word line region I, the part of each of the second sacrificial layers 123 in the word line region I can be removed. The support layer 140 at the other side is retained to support the semiconductor structure, thereby not only reducing the difficulty of removing the part of each of the second sacrificial layers 123 but also ensuring the stability of the semiconductor structure. The forming the first etching hole 191 may include: forming a fourth mask layer (not shown in the figure) after the initial word line layer 150 is formed, wherein the fourth mask layer includes a fourth etching window exposing the support region II at either side of the word line region I, and etching to remove the support layer 140 in the support region II exposed by the fourth etching window, to form the first etching hole 191 as shown in FIG. 11, wherein the first etching hole 191 exposes the part of each of the second sacrificial layers 123 in the word line region I. The forming the second etching hole 192 may include: through the first etching hole 191, removing the part of each of the second sacrificial layers 123 in the word line region I by selecting an etching condition with a high etching rate for the second sacrificial layers 123, to form the second etching hole 192 in the word line region I, as shown in FIG. 12, wherein the second etching hole 192 is in communication with the first etching hole 191 to form the etching hole 190. The first etching hole 191 further exposes a part of each of the first sacrificial layers 122 and a part of each of the second sacrificial layers 123 outside the support region II and the word line region I, that is, a part of each of the first sacrificial layers 122 and a part of each of the second sacrificial layers 123 at a side of the support region II that is away from the word line region I. The part of each of the first sacrificial layers 122 and the part of each of the second sacrificial layers 123 outside the support region II and the word line region I need to be removed when the semiconductor structure is formed subsequently. Therefore, when the part of each of the second sacrificial layers 123 in the word line region I is removed, the part of each of the first sacrificial layers 122 and the part of each of the second sacrificial layers 123, which are exposed by the first etching hole 191, outside the support region II and the word line region I are also removed, to form the semiconductor structure as shown in FIG. 12.

Figure 13:
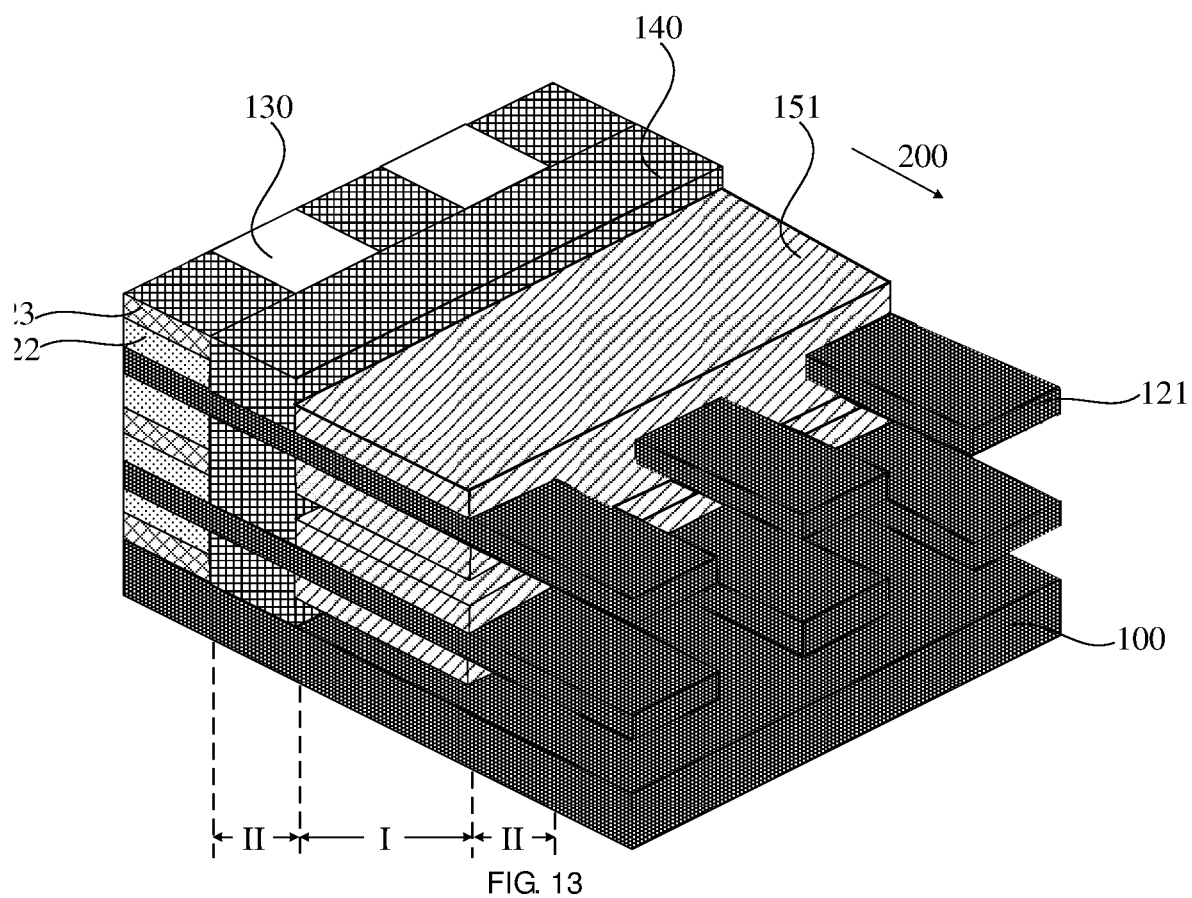

Referring to FIG. 12 to FIG. 13, after the etching hole 190 is formed, the method of forming a semiconductor structure further includes: etching to partially remove the initial word line layer 150 exposed by the etching hole 190, to form a plurality of word line structures 151 arranged at intervals along the direction perpendicular to the surface of the base 100. In this embodiment, through the first etching hole 191 and the second etching hole 192, a part of the initial word line layer 150 between inner walls, which are perpendicular to the surface of the base 100, of parts of the second etching hole 192 is removed, and the initial word line layer 150 is partially removed along the thickness direction in the direction perpendicular to the surface of the base 100, to form a plurality of word line structures 151 arranged at intervals along the direction perpendicular to the surface of the base 100. In an example, the word line structure 151 may extend along a second direction that is parallel to the surface of the base 100 and perpendicular to the first direction 200, and a row of parts of the semiconductor layers 121 arranged at intervals along the second direction in the word line region I share one word line structure 151.

Figure 14:
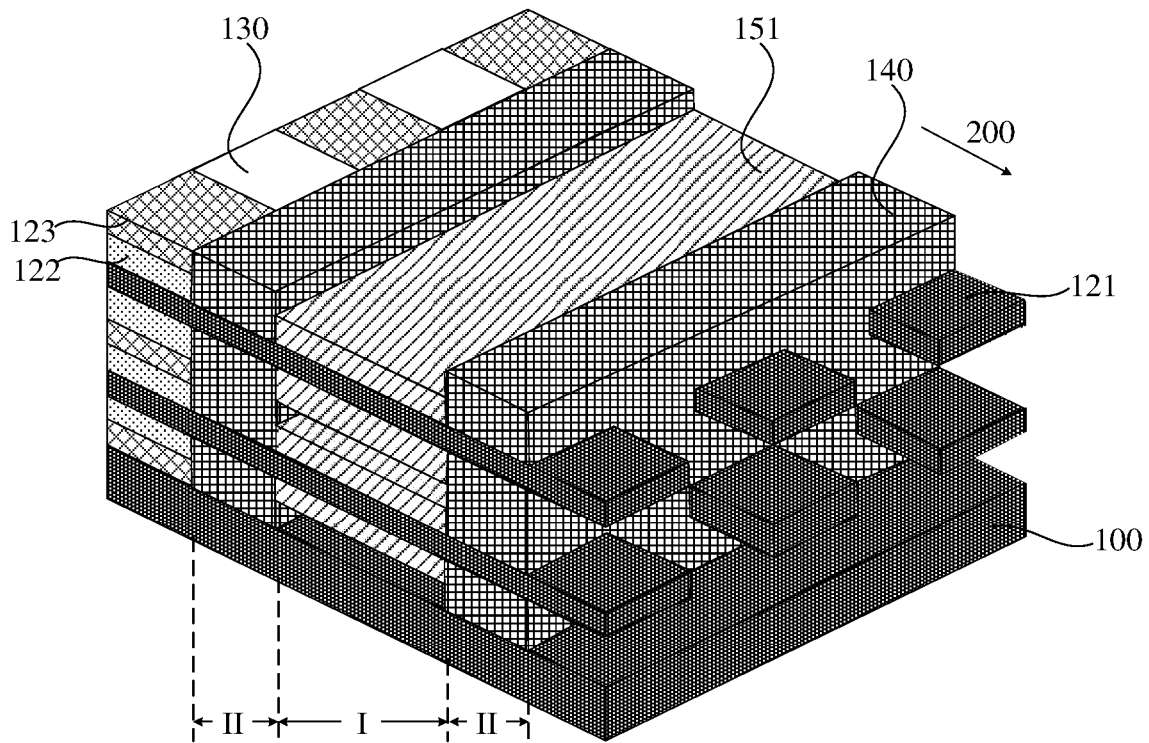

Referring to FIG. 14, after the word line structures 151 are formed, the method further includes: forming a support layer 140 in the first etching hole 191. The first etching hole 191 formed in the foregoing embodiment is used to expose the part of each of the second sacrificial layers 123 and remove the part of each of the second sacrificial layers 123. After the word line structures 151 are formed, the first etching hole 191 may be refilled with a support material to form the support layer 140, thereby improving the stability of the semiconductor structure.

Referring to FIG. 14 to FIG. 15, in some embodiments, after the support layer 140 is formed again, the method further includes: removing the remaining part of each of the first sacrificial layers 122 and the remaining part of each of the second sacrificial layers 123, to obtain the semiconductor structure as shown in FIG. 15.

Referring to FIG. 18, in some embodiments, the method further includes: forming a word line isolation layer 152, wherein the word line isolation layer 152 is located between adjacent ones of the word line structures 151. The word line isolation layer 152 not only support the word line structures 151 such that the structure of the semiconductor is more stable, but also desirably isolate adjacent word line structures 151, which helps reduce the parasitic capacitance between adjacent word line structures 151 and improves the electrical performance of the semiconductor structure. In other embodiments, after the word line structures 151 are formed, air gaps between the word line structures 151 are used as the word line isolation layer 152. To use the air gaps between the word line structures 151 as the word line isolation layer 152 not only helps reduce the difficulty of filling the isolation material but also helps reduce the parasitic capacitance between adjacent word line structures 151 and improve the heat dissipation performance of the semiconductor structure.

In the method of forming a semiconductor structure provided by the foregoing embodiment, stack structures 120 arranged at intervals each include a plurality of semiconductor layers 121; an isolation layer 130 is arranged between adjacent ones of the stack structures 120; a top surface and a bottom surface of each semiconductor layer 121 is each provided with a first sacrificial layer 122; a surface of the first sacrificial layer 122 that is away from the semiconductor layer 121 is provided with a second sacrificial layer 123; parts of the semiconductor layers 121 in the stack structures 120 located in the word line region I of the base 100 are channel regions of transistors. After a part of the isolation layer 130 between the stack structures 120 in the word line region I is removed, parts of the first sacrificial layers 122 on the top surface and bottom surface of each semiconductor layer 121 in the word line region I are removed, and an initial word line layer 150 is formed in a region between the part of each of the semiconductor layers 121 and a part of a corresponding second sacrificial layer 123 in the word line region I and a region between adjacent ones of parts of the semiconductor layers 121 in the word line region I. The appearance of the initial word line layer 150 is defined by using the first sacrificial layer 122 between the semiconductor layer 121 and the second sacrificial layer 123, and distribution positions of the word line structures 151 are defined by using the second sacrificial layers 123, such that the formed initial word line layer 150 has a uniform appearance. Moreover, by partially removing the initial word line layer 150, the evenly distributed word line structures 151 with the uniform appearance are formed. The uniform word line structures 151 help improve the electrical performance of the semiconductor structure.

Accordingly, another embodiment of the present disclosure further provides a semiconductor structure. The semiconductor structure may be formed by the method of forming a semiconductor structure provided by the above embodiment. It is to be noted that contents same as or corresponding to those in the above embodiment may refer to the detailed description in the above embodiment and will not be repeated herein.

Referring to FIG. 15, the semiconductor structure includes: a base 100 and a plurality of semiconductor layers 121 that are located on the base 100, arranged at intervals, and extend along a first direction 200, wherein the base 100 includes a word line region I; and word line structures 151, wherein the word line structures 151 are located on parts of the semiconductor layers 121 in the word line region I and are arranged at intervals along a direction perpendicular to a surface of the base 100. The semiconductor layer 121 may be a semiconductor channel of a GAA transistor. The part of the semiconductor layer 121 located in the word line region I is a channel region of the GAA transistor. The part of the semiconductor layer 121 outside the word line region I includes a doped region of the GAA transistor. The first direction 200 may be any direction parallel to the surface of the base 100, and the word line structure 151 surrounds the channel region. Referring to FIG. 4 to FIG. 13, the word line structure 151 is formed by using the method of sequentially removing the first sacrificial layer 122 and the second sacrificial layer 123 in the foregoing embodiment. Therefore, appearances of different word line structures 151 are similar, and spacing distances between different adjacent word line structures 151 are similar. That is, the word line structures 151 have good uniformity. The uniform word line structures 151 help improve the electrical performance of the semiconductor structure.

Referring to FIG. 15, in some embodiments, the base 100 includes support regions II respectively adjacent to two opposite ends of the word line region I that are arranged along the first direction 200, wherein each of the support regions II has a support layer 140, and the support layer 140 is located in a region between adjacent ones of parts of the semiconductor layers 121 in the support region II. The support layer 140 supports the semiconductor layers 121 on the base 100, helping improve the stability of the semiconductor structure.

Referring to FIG. 18, in some embodiments, the semiconductor structure includes: a word line isolation layer 152, wherein the word line isolation layer 152 is located between adjacent ones of the word line structures 151. On the one hand, the word line isolation layer 152 supports the semiconductor structure such that the structure of the semiconductor is more stable; on the other hand, the word line isolation layer 152 desirably isolates adjacent word line structures 151, which helps reduce the parasitic capacitance between adjacent word line structures 151 and improves the electrical performance of the semiconductor structure.

In some embodiments, the word line structures 151 on top surfaces or bottom surfaces of parts of different semiconductor layers 121 located in the word line region I have a same thickness, and adjacent ones of the word line structures 151 in the word line region I are separated by a same spacing. That is, appearances of different word line structures 151 are the same, and spacing distances between different adjacent word line structures 151 are the same. The word line structures 151 have good uniformity. The uniform word line structures 151 help improve the electrical performance of the semiconductor structure.

In the semiconductor structure provided by the foregoing embodiment, a plurality of semiconductor layers 121 are provided on the base 100, and word line structures 151 surrounding a part of each of the plurality of semiconductor layers 121 in the word line region I are formed by using the method of forming a semiconductor structure provided by the foregoing embodiment. Therefore, appearances of different word line structures 151 are similar, and spacing distances between different adjacent word line structures 151 are similar. That is, the word line structures 151 have good uniformity. The uniform word line structures 151 help improve the electrical performance of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the forming method thereof provided by the embodiments of the present disclosure, parts of the semiconductor layers located in stack structures in a word line region of a base are channel regions; a first sacrificial layer is formed on each of a top surface and a bottom surface of the semiconductor layer; a second sacrificial layer is formed on a surface of the first sacrificial layer that is away from the semiconductor layer; a part of an isolation layer between the stack structures in the word line region is removed; a part of each of the first sacrificial layers on the top surface and bottom surface of the semiconductor layer in the word line region is selectively removed based on different etching rates of materials, which have different properties, of the semiconductor layer, the first sacrificial layer, and the second sacrificial layer, to form an initial word line layer in a region between the part of each of the semiconductor layers and a part of a corresponding second sacrificial layer in the word line region and a region between adjacent ones of parts of the semiconductor layers in the word line region. That is, the appearance of the initial word line layer is defined by using the first sacrificial layer between the semiconductor layer and the second sacrificial layer, and a spacing distance between a part of the initial word line structure on the top surface or bottom surface of the semiconductor layer and a part of the initial word line structure on the opposite side is defined by using the second sacrificial layer, such that the formed initial word line layer is uniform. Because the initial word line layer has high uniformity, the word line structures formed by partially removing the initial word line layer also have high uniformity, thus improving the appearance uniformity of the word line structures and the uniformity of spacing distances between adjacent word line structures.

The invention claimed is:

1. A method of forming a semiconductor structure, comprising:
providing a base and a plurality of stack structures that are located on the base, arranged at intervals, and extend along a first direction, wherein the stack structures each comprise a plurality of semiconductor layers arranged at intervals in a direction perpendicular to a surface of the base, and a top surface and a bottom surface opposite to each other of each of the semiconductor layers are each provided with a first sacrificial layer, a surface of the first sacrificial layer that is away from the semiconductor layer is provided with a second sacrificial layer, a same etching process has different etching rates for the first sacrificial layer and the second sacrificial layer, an isolation layer is provided between adjacent ones of the stack structures, and the base comprises a word line region;
removing a part of the isolation layer in the word line region, to expose a sidewall of a part of each of the first sacrificial layers in the word line region and a sidewall of a part of each of the second sacrificial layers in the word line region;
removing the part of each of the first sacrificial layers in the word line region;
forming an initial word line layer in the word line region, wherein a region between the part of each of the second sacrificial layers and a part of a corresponding semiconductor layer, and a region between adjacent ones of parts of the semiconductor layers are filled with the initial word line layer;
removing the part of each of the second sacrificial layers in the word line region, to form an etching hole; and
partially removing the initial word line layer exposed by the etching hole, to form a plurality of word line structures that are arranged at intervals along the direction perpendicular to the surface of the base.

2. The method of forming a semiconductor structure according to claim 1, wherein the first sacrificial layers have a same thickness, and the second sacrificial layers have a same thickness.

3. The method of forming a semiconductor structure according to claim 1, wherein a material of the first sacrificial layer comprises doped SiGe; and a material of the second sacrificial layer comprises undoped SiGe.

4. The method of forming a semiconductor structure according to claim 1, wherein forming the stack structures and the isolation layer comprises:
forming an initial stack structure on the surface of the base, wherein the initial stack structure comprises a plurality of initial semiconductor layers arranged at intervals in the direction perpendicular to the surface of the base, a top surface and a bottom surface opposite to each other of each of the initial semiconductor layers are each provided with an initial first sacrificial layer, and a surface of the initial first sacrificial layer that is away from the initial semiconductor layer is provided with an initial second sacrificial layer;
patterning the initial stack structure, and forming the plurality of stack structures that are independent of each other; and
forming the isolation layer between adjacent ones of the stack structures.

5. The method of forming a semiconductor structure according to claim 4, wherein the initial first sacrificial layer, the initial second sacrificial layer, and the initial semiconductor layer are formed by using a selective epitaxy process.

6. The method of forming a semiconductor structure according to claim 5, wherein a source material for forming the initial first sacrificial layer comprises a silicon source gas, a germanium source gas, and a dopant source gas; and a source material for forming the initial second sacrificial layer comprises the silicon source gas and the germanium source gas.

7. The method of forming a semiconductor structure according to claim 1, wherein the base further comprises support regions respectively adjacent to two opposite ends of the word line region that are arranged along the first direction, and before the removing a part of the isolation layer in the word line region, the method further comprises:

patterning the isolation layer, to form a plurality of first grooves located in each of the support regions, wherein each of the first grooves exposes a sidewall of a part of each of the first sacrificial layers in the support region and a sidewall of a part of each of the second sacrificial layers in the support region;

removing the part of each of the first sacrificial layers and the part of each of the second sacrificial layers located in the support region; and forming a support layer in each of the support regions, wherein a region between adjacent ones of parts of the semiconductor layers in the support region is filled with the support layer.

8. The method of forming a semiconductor structure according to claim 7, wherein forming the etching hole comprises:

removing the support layer of one of the support regions adjacent to the word line region, and forming a first etching hole; and etching to remove a part of each of the second sacrificial layers exposed by the first etching hole, and forming a second etching hole, wherein the second etching hole is in communication with the first etching hole to form the etching hole; and after forming the word line structures, the method further comprises: forming a support layer in the first etching hole.

9. The method of forming a semiconductor structure according to claim 1, after the removing the part of each of the first sacrificial layers in the word line region and before the forming an initial word line layer, the method further comprises: oxidizing the parts of the semiconductor layers in the word line region to form an oxide layer, such that the parts of the semiconductor layers located in the word line region are chamfered; and removing the oxide layer.

10. The method of forming a semiconductor structure according to claim 9, wherein after the removing the oxide layer, the method further comprises:

forming a gate dielectric layer, wherein the gate dielectric layer covers a surface of each of the parts of the semiconductor layers in the word line region.

11. The method of forming a semiconductor structure according to claim 1, wherein after forming the word line structures, the method further comprises: forming a word line isolation layer, the word line isolation layer being located between adjacent ones of the word line structures.

12. A semiconductor structure, formed by using the method of forming a semiconductor structure according to claim 1, and comprising:

a base and a plurality of semiconductor layers that are located on the base, arranged at intervals, and extend along a first direction, wherein the base comprises a word line region; and word line structures, wherein the word line structures are located on parts of the semiconductor layers in the word line region and are arranged at intervals along a direction perpendicular to a surface of the base.

13. The semiconductor structure according to claim 12, wherein the base further comprises support regions respectively adjacent to two opposite ends of the word line region that are arranged along the first direction, each of the support regions has a support layer, and the support layer is located in a region between adjacent ones of parts of the semiconductor layers in the support region.

14. The semiconductor structure according to claim 12, further comprising: a word line isolation layer, wherein the word line isolation layer is located between adjacent ones of the word line structures.

15. The semiconductor structure according to claim 12, wherein the word line structures on top surfaces or bottom surfaces of parts of different semiconductor layers located in the word line region have a same thickness, and adjacent ones of the word line structures in the word line region are separated by a same spacing.

* * * * *